United States Patent
Cho et al.

(10) Patent No.: US 8,524,554 B2
(45) Date of Patent: Sep. 3, 2013

(54) SEMICONDUCTOR DEVICE AND METHOD FOR FABRICATING THE SAME

(71) Applicants: IMEC, Leuven (BE); Samsung Electronics Co., Ltd., Suwon-si (KR); Taiwan Semiconductor Manufacturing Company, Ltd., HsinChu (TW)

(72) Inventors: Hag-Ju Cho, Seoul (KR); Anabela Veloso, Leuven (BE); HongYu Yu, Singapore (SG); Stefan Kubicek, Pellenberg (BE); Shou-Zen Chang, Hsinchu Country (TW)

(73) Assignees: IMEC, Leuven (BE); Samsung Electronics Co., Ltd., Suwon-si, Gyeonggi-do (KR); Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 13/653,312

(22) Filed: Oct. 16, 2012

(65) Prior Publication Data
US 2013/0052815 A1    Feb. 28, 2013

Related U.S. Application Data

(62) Division of application No. 12/358,188, filed on Jan. 22, 2009, now Pat. No. 8,313,993.

(60) Provisional application No. 61/023,046, filed on Jan. 23, 2008.

(30) Foreign Application Priority Data

Jun. 6, 2008    (EP) .................................... 08157791

(51) Int. Cl.
*H01L 21/8238* (2006.01)

(52) U.S. Cl.
USPC ........... 438/199; 438/275; 438/287; 438/591; 257/E21.639; 257/406; 257/411

(58) Field of Classification Search
USPC ................ 438/199, 287, 591, 275, 240, 216; 257/E21.639, 406, 411
See application file for complete search history.

(56) References Cited

U.S. PATENT DOCUMENTS

| | | | |
|---|---|---|---|
| 6,436,777 B1 * | 8/2002 | Ota .............................. | 438/305 |
| 6,812,101 B2 * | 11/2004 | Moriwaki et al. ............. | 438/287 |
| 7,586,159 B2 | 9/2009 | Lee et al. | |
| 7,625,791 B2 * | 12/2009 | Tseng et al. .................. | 438/199 |
| 7,772,073 B2 * | 8/2010 | Clark et al. ................... | 438/287 |

(Continued)

FOREIGN PATENT DOCUMENTS

| | | |
|---|---|---|
| CN | 1619817 A | 5/2005 |
| EP | 1531496 A2 | 5/2005 |

OTHER PUBLICATIONS

Chang, "A Dy2O3-capped Hfo2 Dielectric and TaCx-based Metals Enabling Low-Vt Single-Metal-Single-Dielectric Gate Stack", Electron Device Meeting, 2007, Conference Publications, Date of Conference: Dec. 10-12, 2007, Washington D.C., pp. 535-538.

(Continued)

*Primary Examiner* — Michael Trinh
(74) *Attorney, Agent, or Firm* — Knobbe Martens Olson & Bear LLP

(57) ABSTRACT

A dual work function semiconductor device and method for fabricating the same are disclosed. In one aspect, a device includes a first and second transistor on a first and second substrate region. The first and second transistors include a first gate stack having a first work function and a second gate stack having a second work function respectively. The first and second gate stack each include a host dielectric, a gate electrode comprising a metal layer, and a second dielectric capping layer therebetween. The second gate stack further has a first dielectric capping layer between the host dielectric and metal layer. The metal layer is selected to determine the first work function. The first dielectric capping layer is selected to determine the second work function.

20 Claims, 5 Drawing Sheets

(56) References Cited

U.S. PATENT DOCUMENTS

| | | |
|---|---|---|
| 2002/0190302 A1 | 12/2002 | Bojarczuk, Jr. et al. |
| 2002/0195643 A1 | 12/2002 | Harada |
| 2005/0098839 A1* | 5/2005 | Lee et al. .................. 257/410 |
| 2007/0178637 A1* | 8/2007 | Jung et al. .................. 438/216 |
| 2007/0257309 A1 | 11/2007 | Lee |

OTHER PUBLICATIONS

European Search Report dated Oct. 21, 2008 for EP Application No. 08157791.8, 10 pages.

Cho et al., "Nitrogen Profile and Dielectric Cap Layer (Al2O3, Dy2O3, La2O3) Engineering on Hf-Silicate", IEEE May 2007, Integrated Circuit Design and Technology, pp. 1-3.

Choi et al., "The Impact of Stacked Cap Layers on Effective Work Function with HfSiON and SiON Gate Dielectrics", IEEE Electron Device Letters, Jul. 2008, vol. 29, No. 7, pp. 743-745, US.

Yamamoto et al., "Study of La-Induced Flat Band Voltage Shift in Metal/HfLaOx/SiO2/Si Capacitors", Japanese Journal of Applied Physics, Part I, Nov. 2007, vol. 46, No. 11, Japan Society of Applied Physics, pp. 7251-7255.

\* cited by examiner

SEMICONDUCTOR DEVICE AND METHOD FOR FABRICATING THE SAME

CROSS REFERENCE TO RELATED APPLICATIONS

This application is a divisional of U.S. patent application Ser. No. 12/358,188 filed Jan. 22, 2009, U.S. Pat. No. 8,313,993, which claims priority under 35 U.S.C. §119(e) to U.S. provisional patent application 61/023,046 filed on Jan. 23, 2008. Each of the above application is hereby incorporated by reference in its entirety.

BACKGROUND OF THE INVENTION

1. Field of the Invention

The invention is related to methods of manufacturing semiconductor devices. Particularly, the invention is related to dual work function semiconductor devices having a gate stack comprising high-k materials and a single metal gate electrode.

2. Description of the Related Technology

Scaling MOSFET's to improve performance lead to higher gate leakage as the $SiO_2$ gate dielectric becomes thinner. To address this issue, $SiO_2$ gate dielectric has been replaced with high-k materials (e.g. Hf-based or Al-based material with a dielectric constant $k>k_{SiO2}$). With the introduction of the high-k materials a new problem aroused, namely the Fermi level pinning effect, originating in the interaction between high-k material and polysilicon. Fermi level pinning is a fundamental characteristic of the polysilicon (polySi)/metal oxide interface that causes high threshold voltages in MOSFET devices.

A known solution to this problem is the introduction of metal gate materials. However, it has been proven difficult to identify band-edge metals (metals with either a n-type or a p-type work function (WF), required for low threshold voltage, $V_t$) that are compatible with the conventional CMOS fabrication process. CMOS can be made using dual metal gates with single or dual dielectrics. In either case, a selective removal of one of the metal gates is necessary and adds substantial complexity and costs to the manufacturing process.

Another known solution for CMOS manufacturing is to use Fully Silicided (FUSI) gate, without a selective removal of electrode or gate dielectric. However, in this approach, FUSI gates require different silicide phases on nMOS and pMOS. On small devices, the phase or composition of the FUSI gates tends to distribute unevenly, resulting in severe within-wafer threshold voltage ($V_t$) non-uniformity.

SUMMARY OF CERTAIN INVENTIVE ASPECTS

One inventive aspect relates to a semiconductor device with good performance and a method of making the same.

Another inventive aspect relates to a method for manufacturing a dual work function semiconductor device comprising a single metal gate electrode and a gate dielectric comprising dielectric capping layers and the semiconductor device thereof.

Another inventive aspect relates to a method for manufacturing a dual work function semiconductor device comprising a single metal gate electrode and a gate dielectric comprising dielectric capping layers, which overcomes at least one of the drawbacks of prior art methods and has the advantage of improved manufacturability.

Certain inventive aspects relate to a method of manufacturing a dual work function semiconductor device, comprising providing a substrate with a first region and a second region; forming a first gate stack comprising a gate dielectric and a gate electrode on the first region, having a first effective work function; forming a second gate stack comprising a gate dielectric and a gate electrode on the second region having a second effective work function; wherein the process of forming the gate dielectric and the gate electrode comprises: forming a host dielectric layer overlying the first and the second region of the substrate; selectively forming a first dielectric capping layer on the second region, wherein the first dielectric capping layer is in direct contact with the host dielectric and is selected to determine the second effective work function of the second gate stack; forming a second dielectric capping layer overlying the host dielectric on the first region and the first capping layer on the second region, wherein the second dielectric capping layer is selected to have essentially no influence on the second effective work function of the second gate stack; and forming the gate electrode comprising a metal layer overlying and in contact with the second dielectric capping layer on the first region and the second region, wherein the metal layer is selected to determine in combination with the second dielectric capping layer the first effective work function of the first gate stack.

The method according to the above, wherein the first region is a NMOS region and the second region is a PMOS region.

The method according to the above, wherein the first dielectric capping layer is an Al-based dielectric.

The method according to the above, wherein the first dielectric capping layer is selected from the group of AlO, AlN and mixtures thereof.

The method according to any of the above, wherein the second dielectric capping layer is a lanthanide-based dielectric.

The method according to the above, wherein the second dielectric capping layer is selected from the group of DyO, LaO GdO, ErO and mixtures thereof.

The method according to any of the above, wherein the metal layer is made of a material having a n-type work function.

The method according to the above, wherein the metal layer is made of a material selected from a group of $Ta_xC_y$, with x and y real numbers $0<x, y<1$.

The method according to the above, wherein the first region is a PMOS region and the second region is a NMOS region.

The method according to the above, wherein the first dielectric capping layer is a lanthanide-based dielectric.

The method according to the above, wherein the first dielectric capping layer is selected from the group of DyO, LaO GdO, ErO and mixtures thereof.

The method according to any of the above, wherein the second dielectric capping layer is an Al-based dielectric.

The method according to the above, wherein the second dielectric capping layer is selected from the group of AlO, AlN and mixtures thereof.

The method according to any of the above, wherein the metal layer is made of a material having a p-type work function.

The method according to the above, wherein the metal layer includes or consists of $Ta_xC_yN_zO_w$, with x,y,z,w real numbers and $0<x,y,z,w<1$.

The method according to the above, wherein the host dielectric is selected from the group of $SiO_2$, SiON, $HfO_2$, $ZrO_2$ and mixtures thereof.

The method according to the above, wherein the process of selectively forming the first dielectric capping layer further comprises depositing the first dielectric capping layer overlying the host dielectric; forming a mask thereby covering the first dielectric capping layer; patterning the mask to expose the first dielectric capping layer on the first region; removing the exposed first dielectric capping layer on the first region selectively to the host dielectric.

The method according to the above, wherein the selective removal is done by wet etch.

The method according to the above, further comprising selectively forming a dielectric buffer layer in between the first dielectric capping layer and the second dielectric capping layer, wherein the dielectric buffer layer is selected to prevent the intermixing between the first and the second dielectric capping layer.

The method according to the above, wherein the process of forming the dielectric buffer layer comprises a nitridation of the first capping layer.

The method according to the above, wherein the process of forming the dielectric buffer layer comprises depositing 1-10 cycles of ALD HfO2 or HfSiO.

A dual work function semiconductor device, comprising a first transistor on a first substrate region and a second transistor on a second substrate region, whereby the first transistor comprises a first gate stack having a first effective work function and the second transistor comprises a second gate stack having a second effective work function, whereby the first gate stack and the second gate stack comprise each a host dielectric in contact with the substrate, a gate electrode comprising a metal layer and a second dielectric capping layer in between the host dielectric and the gate electrode and in contact with the metal layer of the gate electrode, the second gate stack comprises in addition a first dielectric capping layer in between the host dielectric layer and the metal layer of the gate electrode, in contact with the host dielectric, wherein the first dielectric capping layer is selected to determine the second effective work function of the second gate stack, wherein the second dielectric capping layer is selected to have essentially no influence on the second effective work function of the second gate stack, and wherein the metal layer is selected to determine in combination with the second dielectric capping layer the first effective work function of the first gate stack.

The semiconductor device of the above, wherein the first dielectric capping layer is an Al-based dielectric.

The semiconductor device of the above, wherein the first dielectric capping layer is selected from the group of AlO, AN and mixtures thereof.

The semiconductor device of the above, wherein the second dielectric capping layer is a lanthanide-based dielectric.

The semiconductor device of the above, wherein the second dielectric capping layer is selected from the group of DyO, LaO GdO, ErO and mixtures thereof.

The semiconductor device of the above, wherein the metal layer is made of a material having a n-type work function.

The semiconductor device of the above wherein the metal layer includes or consists of $Ta_xC_y$, with x and y real numbers $0<x, y<1$.

The semiconductor device of the above, wherein the first dielectric capping layer is a lanthanide-based dielectric.

The semiconductor device of the above wherein the first dielectric capping layer is selected from the group of DyO, LaO GdO, ErO and mixtures thereof.

The semiconductor device of the above, wherein the second dielectric capping layer is an Al-based dielectric.

The semiconductor device of the above, wherein the second dielectric capping layer is selected from the group of AlO, AN and mixtures thereof.

The semiconductor device of the above, wherein the metal gate layer is made of a material having a p-type work function.

The semiconductor device of the above, wherein the metal layer includes or consists of $Ta_xC_yN_zO_w$, with x,y,z,w real numbers and $0<x,y,z,w<1$.

The semiconductor device of the above, wherein the host dielectric is selected from the group of $SiO_2$, SiON, $HfO_2$, $ZrO_2$ and mixtures thereof.

The semiconductor device of the above, further comprising a dielectric buffer layer (5) sandwiched in between the first dielectric capping layer (2) and the second dielectric capping layer (3) on the second substrate region (II), wherein the dielectric buffer layer (5) is selected to prevent the intermixing between the first and the second dielectric capping layer.

BRIEF DESCRIPTION OF THE DRAWINGS

All drawings are intended to illustrate some inventive aspects and embodiments. The drawings described are only schematic and are non-limiting.

DETAILED DESCRIPTION OF CERTAIN INVENTIVE EMBODIMENTS

Figure 1A:
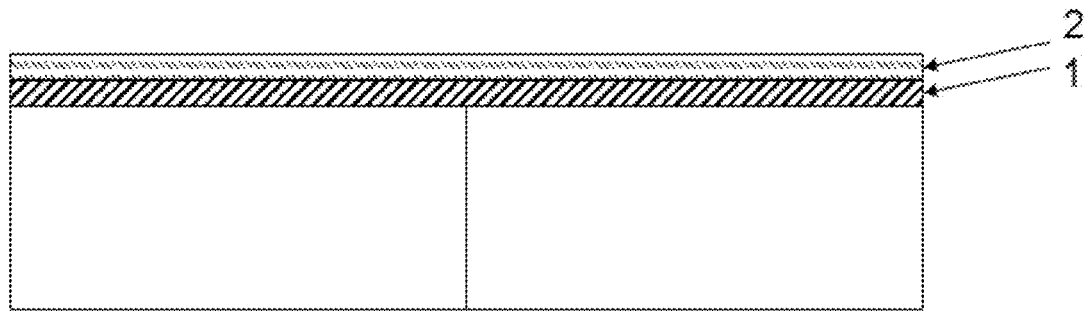
FIGS. 1(a), (b), (c) represent schematically the gate stack of a semiconductor device comprising two regions (I, II), a host dielectric layer (1), a first capping layer (2), a second capping layer (3) and a metal gate electrode (4).
Figure 1B:
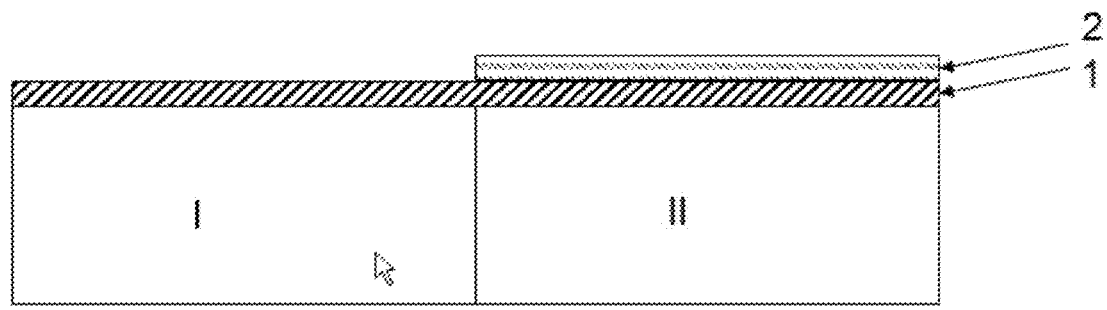
Figure 1C:
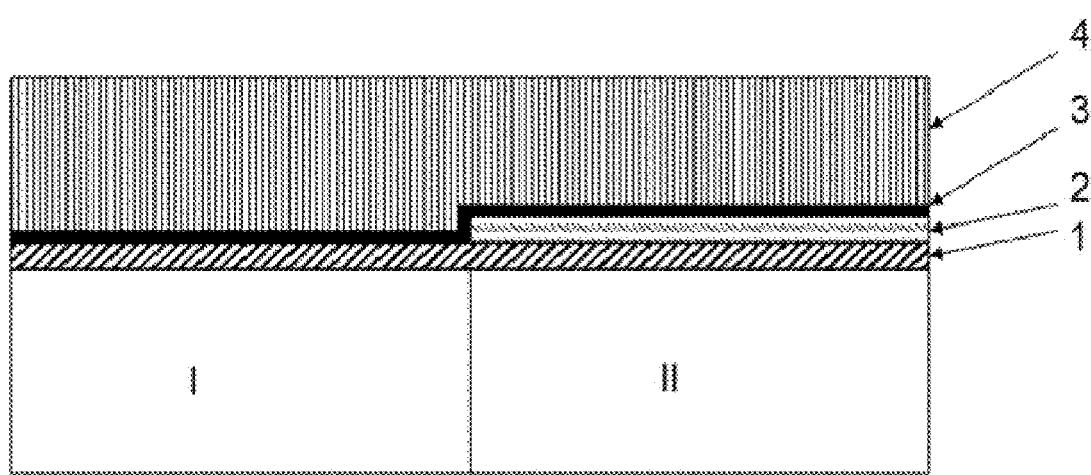

The present invention will be described with respect to particular embodiments and with reference to certain drawings but the invention is not limited thereto but only by the claims. Any reference signs in the claims shall not be construed as limiting the scope. The drawings described are only schematic and are non-limiting. In the drawings, the size of some of the elements may be exaggerated and not drawn on scale for illustrative purposes.

Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

The terms deeper or higher are used to denote the relative position of elements in a substrate. With deeper is meant that these elements are more distant from a main surface of the substrate from which side the measurement is to be performed.

Various embodiments of the invention are referring to parameters of the semiconductor device such as threshold voltage, effective work function (eWF), or physical characteristics of the material(s) employed such as work function, Fermi level etc. The definitions as used through this document are summarized herein below.

In the MOSFET device, the gate requires a threshold voltage (Vt) to render the channel conductive. Complementary MOS processes fabricate both n-channel and p-channel (NMOS and PMOS) transistors. The threshold voltage is influenced by what is called the effective work function difference. To establish threshold voltage (Vt) values, the effective work function differences of the respective PMOS and NMOS gate materials (gate stacks) and their corresponding channel regions are independently established through channel processing and gate processing. In other words, both gate dielectric (including or consisting i.e. of a host dielectric and different capping layers) and gate electrode (including or consisting i.e. of at least one metal layer) determine the effective work function of the gate stack (device). Moreover, the gate processing itself (i.e. the sequence of the different steps and/or the thermal treatments applied) may have an influence on the effective work function of the gate stack (device).

The effective work function of a gate stack (device) is a parameter that can be tuned (adjusted/modified) by the choice of the gate dielectric materials, gate electrode materials and by the gate processing performed. On the contrary, the work function of the gate electrode (often referred to as metal gate electrode/metal layer) is an intrinsic property of the material. In general, the work function of a certain material (i.e. a metal layer) is a measure of the energy, in electron volts (eV), required to eject an electron in the material outside of a material atom to the vacuum, if the electron were initially at the Fermi level.

For a silicon substrate, the gate electrode of a negative channel MOSFET (or NMOS) device would have an n-type work function of approximately 4.1 eV (+/−0.3 eV), and the gate electrode of a positive channel MOSFET (or PMOS) device would have a p-type work function of approximately 5.2 eV (+/−0.3 eV).

In a first inventive aspect a method for manufacturing a dual work function semiconductor device is disclosed, comprising providing a substrate with a first region (I) and a second region (II), forming a first gate stack comprising a gate dielectric and a gate electrode on the first region, having a first effective work function (eWF1), forming a second gate stack comprising a gate dielectric and a gate electrode on the second region having a second effective work function (eWF2), wherein the process of forming the gate dielectric and the gate electrode comprises: (i) forming a host dielectric layer (1) overlying the first (I) and the second region (II) of the substrate, (ii) selectively forming a first dielectric capping layer (2) on the second region, wherein the first dielectric capping layer is in direct contact with the host dielectric (1) and is selected to determine the second effective work function (eWF2) of the second gate stack, (iii) forming a second dielectric capping layer (3) overlying the host dielectric (1) on the first region (1) and the first capping layer (2) on the second region (II), wherein the second dielectric capping layer (3) is selected to have essentially no influence on the second effective work function (eWF2) of the second gate stack, and (iv) forming the gate electrode comprising a metal layer (4) overlying and in contact with the second dielectric capping layer (3) on the first region (I) and the second region (II), wherein the metal layer (4) is selected to determine in combination with the second dielectric capping layer (3) the first effective work function (eWF1) of the first gate stack.

In one embodiment of the first aspect of the invention the first region is a NMOS region and the second region is a PMOS region. The first dielectric capping layer is an Al-based dielectric. Advantageously, the first dielectric capping layer is selected from the group of AlO, AN and mixtures thereof.

In the same embodiment the second dielectric capping layer is a lanthanide-based dielectric. Advantageously, the second dielectric capping layer is selected from the group of DyO, LaO GdO, ErO and mixtures thereof. The process of forming the second dielectric capping layer may comprise a post-treatment such as a thermal anneal and/or a nitridation.

Further in the same embodiment, the metal gate electrode comprises a metal layer with an (as deposited/intrinsic) n-type work function. Advantageously, the metal gate electrode includes or consists of a metal layer having a n-type work function. The metal layer may comprise a Ta-, Ti-based material with a thickness between 1 and 200 Angstroms. More advantageously, the metal layer includes or consists of TaxCy, with x and y real numbers and $0<x, y<1$.

Where, herein, a specific chemical name or formula is given, the material may include non-stoichiometric variations of the stoichiometrically exact formula identified by the chemical name. Lack of numerical subscript by an element in the formula stoichiometrically signifies the number one (1). Variations in the range plus/minus about 20% of the exact stoichiometric number are comprised in the chemical name or formula, for the present purposes. Where an algebraic subscript is given, then variations in the range plus/minus about 20% are comprised relative to the value of each subscript. Such varied values do not necessarily sum to a whole number and this departure is contemplated. Such variations may occur due to either intended selection and control of the process conditions, or due to unintended process variations.

In another embodiment of the first aspect of the invention, the first region is a PMOS region and the second region is a NMOS region. The first dielectric capping layer is a lanthanide-based dielectric. Advantageously, the first dielectric capping layer is selected from the group of DyO, LaO GdO, ErO and mixtures thereof.

Further, in the same embodiment, the second dielectric capping layer is an Al-based dielectric. Advantageously, the second dielectric capping layer is selected from the group of AlO, AN and mixtures thereof. The process of forming the second dielectric capping layer may comprise a post-treatment such as a thermal anneal and/or a nitridation.

Furthermore, in the same embodiment the metal gate electrode comprises a metal layer having a (as-deposited/intrinsic) p-type work function. Advantageously, the metal gate electrode includes or consists of a metal layer having a p-type work function. The metal layer may comprise a Ta-, W-, Mo-based material with a thickness between about 1 and 200 A. Thicker layers may also be considered. More advantageously, the metal gate electrode includes or consists of $Ta_xC_yN_zO_w$, with x,y,z,w real numbers and $0<x,y,z,w<1$.

In certain embodiments, the host dielectric is selected from the group of $SiO_2$, SiON, $HfO_2$, $ZrO_2$ and mixtures thereof. These materials present the advantage of a stable interface with the silicon substrate. The host dielectric is formed on the semiconductor substrate by thermal oxide growth or CVD/ALD deposition. On silicon substrates, before forming the host dielectric, the substrate may comprise a very thin (about 0.4-1 nm, mostly 0.4-0.7 nm) interfacial oxide formed as a result of a conventional pre-treatment like e.g. a cleaning or a high-temperature annealing treatment. The interfacial oxide alone does not have the required properties of a host dielectric (i.e. electrostatic integrity, equivalent oxide thickness, layer uniformity) and therefore cannot be considered as a replacement of the host dielectric.

In another embodiment of the first aspect of the invention, a method for manufacturing a semiconductor device is disclosed, wherein the process of selectively forming the first dielectric capping layer further comprises depositing the first dielectric capping layer overlying the host dielectric, forming a mask thereby covering the first dielectric capping layer, patterning the mask to expose the first dielectric capping layer on the first region and removing the exposed first dielectric capping layer on the first region selectively to the host dielectric.

The selective removal towards the host dielectric can be done either by wet etch in mild chemical solutions or by dry etch and in both cases should not damage the upper surface of the host dielectric.

Figure 2A:
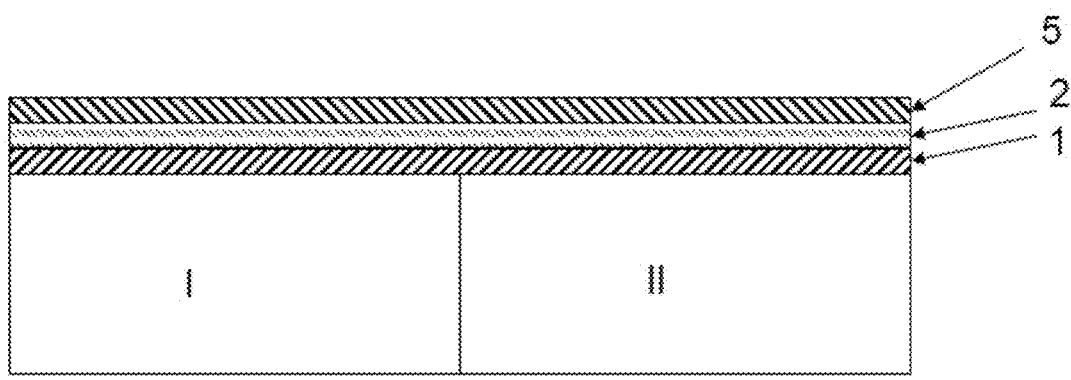
FIGS. 2(a), (b), (c) represent schematically the gate stack of a semiconductor device comprising two regions (I, II), a host dielectric layer (1), a first capping layer (2), a buffer layer (5), a second capping layer (3) and a metal gate electrode (4).
Figure 2B:
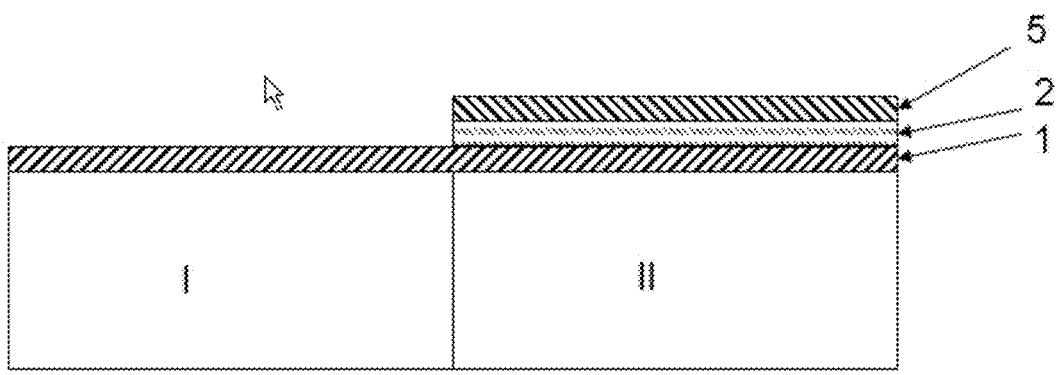
Figure 2C:
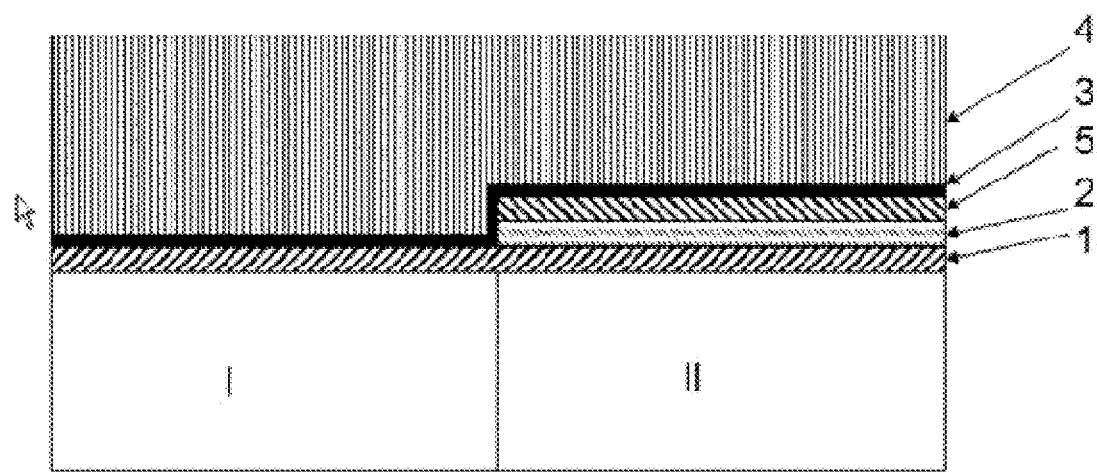

In yet another embodiment of the first aspect of the invention, a method for manufacturing a semiconductor device is disclosed, further comprising selectively forming a dielectric buffer layer (5) as represented in FIG. 2(a), (b), (c) overlying the first dielectric capping layer (2) and underlying the second dielectric capping layer (3), selected to prevent the intermixing between the first and the second dielectric capping layer.

Advantageously, the process of forming the dielectric buffer layer comprises incorporating nitrogen into the first dielectric capping layer at its top surface, by performing, e.g. a DPN (decoupled plasma nitridation) treatment or a $NH_3$ anneal. Alternatively, the dielectric buffer layer can be formed by depositing about 1-10 cycles of ALD $HfO_2$ or HfSiO.

In a different embodiment the dielectric buffer layer can be formed by depositing 1-10 cycles of ALD (Atomic Layer Deposition) n-type metal (metal having a n-type work function, e.g. $Ta_xC_y$) on a first dielectric capping layer including or consisting of lanthanide-based material. Alternatively, the dielectric buffer layer can be formed by depositing about 1-10 cycles of ALD p-type metal (metal having a p-type work function, e.g. $Ta_xC_yN_zO_w$) on a first dielectric capping layer including or consisting of Al-based material.

In a second aspect of the invention a dual work function semiconductor device is disclosed, comprising a first transistor on a first substrate region and a second transistor on a second substrate region, whereby the first transistor comprises a first gate stack having a first effective work function and the second transistor comprises a second gate stack having a second effective work function, whereby the first gate stack and the second gate stack comprise each a host dielectric in contact with the substrate, a gate electrode comprising/(consisting of) a metal layer and a second dielectric capping layer in between the host dielectric and the gate electrode and in contact with the metal layer of the gate electrode, the second gate stack comprises in addition a first dielectric capping layer in between the host dielectric layer and the metal layer of the gate electrode, in contact with the host dielectric, wherein the first dielectric capping layer is selected to determine the second effective work function of the second gate stack, wherein the second dielectric capping layer is selected to have essentially no influence on the second effective work function of the second gate stack, and wherein the metal layer is selected to determine in combination with the second dielectric capping layer the first effective work function of the first gate stack.

The metal layer 'determines' the first effective work function of the first gate stack, when the first gate stack including or consisting of the host dielectric, the second dielectric capping layer and the metal layer has an effective work function substantially equal with the (intrinsic, as deposited) work function of the metal layer (e.g. use a n-type metal layer to achieve an n-type first effective work function or a p-type metal layer to achieve an p-type first effective work function). In other words, the work function shift induced by the host dielectric and the second dielectric capping layer is small in comparison with the (intrinsic) work function of the metal layer.

The first dielectric capping layer 'determines' the second effective work function of the second gate stack, when the work function shift induced by the first dielectric capping layer modifies considerably the (intrinsic, as deposited) work function of the metal layer. Consequently, the second effective work function of the second gate stack including or consisting of the host dielectric, the first dielectric capping layer, the second dielectric capping layer and the metal layer is different than the (intrinsic, as deposited) work function of the metal layer (e.g. n-type metal layer and p-type second effective work function or p-type metal layer and n-type second effective work function).

In a first embodiment of the second aspect of the invention, the first dielectric capping layer is an Al-based dielectric. Advantageously the first dielectric capping layer is selected from the group of AlO, AN and mixtures thereof.

In the same embodiment, the second dielectric capping layer is a lanthanide-based dielectric. Advantageously the second dielectric capping layer is selected from the group of DyO, LaO GdO, ErO and mixtures thereof.

Further in the same embodiment the metal gate electrode comprises a metal layer having a (as-deposited/intrinsic) n-type work function. Advantageously, the metal gate electrode includes or consists of a metal layer having a n-type work function. More advantageously, the metal layer electrode is selected from a group of $Ta_xC_y$, with x and y real numbers and $0<x, y<1$.

In a second embodiment of the second aspect of the invention, the first dielectric capping layer is a lanthanide-based dielectric. Advantageously, the first dielectric capping layer is selected from the group of DyO, LaO GdO, ErO and mixtures thereof.

In the same embodiment, the second dielectric capping layer is an Al-based dielectric. Advantageously, the second dielectric capping layer is selected from the group of AlO, AN and mixtures thereof.

Further in the same embodiment, the metal gate electrode comprises a metal layer having a (as-deposited/intrinsic) p-type work function. Advantageously, the metal gate electrode includes or consists of a metal layer having a n-type work function. More advantageously, the metal gate layer includes or consists of $Ta_xC_yN_zO_w$, with x,y,z,w real numbers and $0<x,y,z,w<1$.

In another embodiment of the second aspect of the invention, the semiconductor device further comprises a dielectric buffer layer (5) as represented in FIG. 2(a), (b), (c) sandwiched in between the first dielectric capping layer (2) and the second dielectric capping layer (3), wherein the dielectric buffer layer is selected to prevent the intermixing between the first and the second dielectric capping layer.

Advantageously, the dielectric buffer layer is formed by incorporating nitrogen into the first dielectric capping layer (2) at its top surface. Alternatively, the dielectric buffer layer is a thin layer (1-10 cycles) of ALD HfO$_2$ or HfSiO.

In a different embodiment the dielectric buffer layer (5) is thin layer (1-10 cycles) of ALD n-type metal (metal having a n-type work function, e.g. Ta$_x$C$_y$) on a first dielectric capping layer (2) including or consisting of lanthanide-based material. Alternatively, the dielectric buffer layer (5) is a thin layer (1-10 cycles) of ALD p-type metal (metal having a p-type work function, e.g. Ta$_x$C$_y$N$_z$O$_w$) on a first dielectric capping layer (2) including or consisting of Al-based material.

The invention will now further be described by a detailed description of several particular embodiments of the invention. It is clear that other embodiments of the invention can be configured according to the knowledge of persons skilled in the art without departing from the true spirit or technical teaching of the invention.

FIGS. 1(a), (b), (c) represent schematically the gate stack of a semiconductor device comprising two regions (I, II), a host dielectric layer (1), a first capping layer (2), a second capping layer (3) and a metal gate electrode (4). In one particular example the first capping layer (2) (or the "NMOS capping layer") includes or consists of dysprosium oxide (DyO$_x$, 0<x<2). As shown in FIG. 1(a), (b), (c) DyO$_x$ capping layer (2) is deposited on a HfSiON host dielectric layer (1) and removed selectively from the PMOS region (I). Then, a second dielectric capping layer, including or consisting of e.g. AlO$_x$, with 0<x<2, is deposited, resulting in a AlO$_x$/DyO$_x$ dielectric stack on HfSiON host dielectric (1) in the NMOS region (II) and an AlO$_x$ layer on HfSiON host dielectric in the PMOS region (I).

It has been shown that AlO$_x$ on HfSiON is modifying the effective work function of the gate stack towards p-type values, while the effective work function of the gate stack (gate stack comprises the metal gate electrode and the gate dielectric) on the NMOS region is still determined by the DyO$_x$ capping on HfSiON. Surprisingly, the AlO$_x$ capping layer on DyO$_x$ has no significant influence on the effective work function of the gate stack on the NMOS region. In other words, the first dielectric capping layer, in contact with the host dielectric determines the effective work function of the gate stack, even upon depositing of the second dielectric capping layer.

Figure 3:
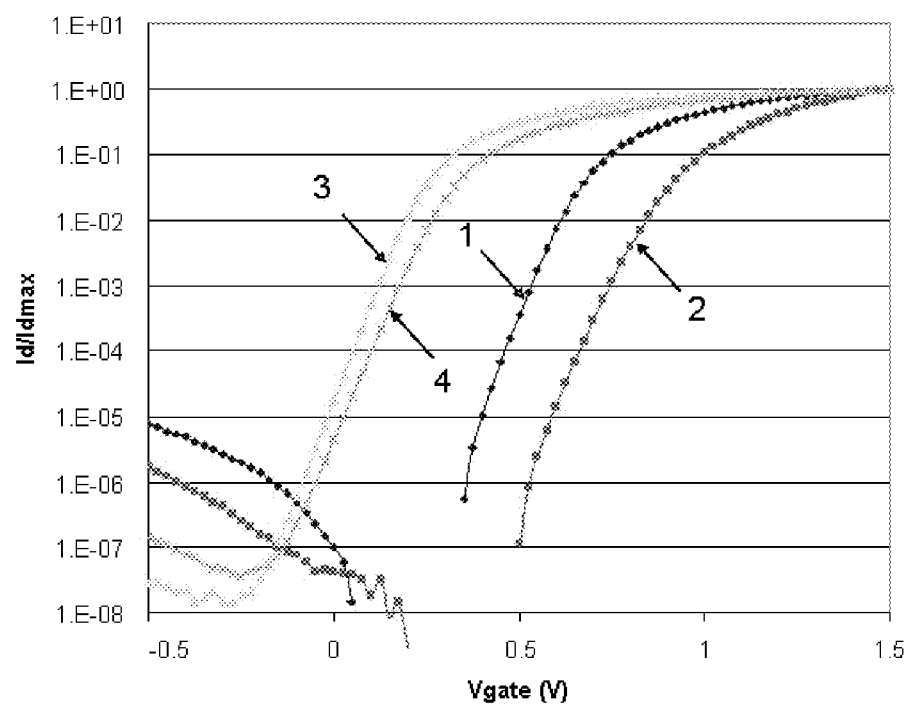
FIG. 3 represents the drive current $I_d$ as function of the applied Vg, for NMOS devices comprising different capping layers overlying the host dielectric (HfSiON): (1) HfSiON without capping layer (reference sample); (2) HfSiON with $AlO_x$ capping layer, where $0<x<2$; (3) HfSiON with $LaO_x$ capping layer, where $0<x<2$; (4) HfSiON with $LaO_x$ as first capping layer and $AlO_x$ as second capping layer, where $0<x<2$.

The feasibility of this integration scheme is evidenced by FIG. 3 which shows Id-Vg curves of four different long transistors (W/L=10/10 μm) with TaC$_x$ metal gate electrode. A dielectric capping layer including or consisting of LaO$_x$ with a thickness of about 1 nm and a dielectric capping layer including or consisting of AlO$_x$ with a thickness of about 1 nm are separately deposited on a host dielectric layer including or consisting of HfSiON. In another experiment, a second dielectric capping layer (AlO$_x$) is deposited on a first dielectric capping layer (LaO$_x$) on a host dielectric (HfSiON), to evaluate the effect of the second capping layer on the effective work function of the dielectric—metal stack (or the related threshold voltage, V$_t$).

FIG. 3 shows that AlO$_x$ (AlO$_x$/HfSiON, curve 2) shifts the effective work function of NMOS reference sample (Hf-SiON, curve 1)) by about 200 mV in the positive direction, while LaO$_x$ (LaO$_x$/HfSiON, curve 3) shifts the effective work function of the reference sample in the negative direction by about 400 mV. Surprisingly, the addition of AlO$_x$ as a second dielectric capping layer on a first dielectric capping layer (AlO$_x$/LaO$_x$/HfSiON, curve 4) does not change significantly the effective work function of the LaO$_x$-capped device. In this later case, a similar shift of about 400 mV in the negative direction is observed in the effective work function of the reference sample.

The foregoing embodiments can be applied in different areas of semiconductor device manufacturing. While these embodiments are described in conjunction with a MOS transistor and more particularly to a planar a CMOS device, it will be apparent to those ordinary skilled in the art that the benefits of these embodiments can be applied to other transistor architectures such as MUltiple Gate FET (MUGFET's) transistors and other structures such as memory cell capacitors or other memory circuits. In particular, one ordinary skilled in the art can imagine other situations where similar electrical and physical properties are desired.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention.

What is claimed is:

1. A method of manufacturing a dual work function semiconductor device having a substrate with a first region and a second region, the method comprising:
   forming a first gate stack having a first effective work function;
   forming a second gate stack having a second effective work function;
   wherein the forming of a first gate stack and the forming of a second gate stack comprise:
      forming a host dielectric on and in contact with a substrate in a first and a second region of the substrate;
      selectively forming a first dielectric capping layer and a dielectric buffer layer on the second region but not on the first region, wherein the first dielectric capping layer is over and in direct contact with the host dielectric, wherein the dielectric buffer layer is over the first dielectric capping layer;
      forming a second dielectric capping layer overlying the host dielectric on the first region and the dielectric buffer layer on the second region; and
      forming a gate electrode comprising a metal layer overlying and in contact with the second dielectric capping layer on the first region and the second region,
   wherein the dielectric buffer layer is selected to prevent intermixing between the first and second dielectric capping layer,
   wherein the metal layer is selected to determine in combination with the second dielectric capping layer and the host dielectric the first effective work function of the first gate stack, and
   wherein the first dielectric capping layer is selected to determine in combination with the second dielectric capping layer, the host dielectric and the metal layer the second effective work function of the second gate stack.

2. The method according to claim 1, wherein the first dielectric capping layer is an Al-based dielectric.

3. The method according to claim 2, wherein the first dielectric capping layer is selected from the group of AlO, AN and mixtures thereof.

4. The method according to claim 1, wherein the second dielectric capping layer is a lanthanide-based dielectric.

5. The method according to claim 4, wherein the second dielectric capping layer is selected from the group of DyO, LaO GdO, ErO and mixtures thereof.

6. The method according to claim 1, wherein the metal layer is made of a material having a n-type work function.

7. The method according to claim 6, wherein the metal layer comprises $Ta_xC_y$, with x and y real numbers $0<x, y<1$.

8. The method according to claim 1, wherein the first dielectric capping layer is a lanthanide-based dielectric.

9. The method according to claim 8, wherein the first dielectric capping layer is selected from the group of DyO, LaO GdO, ErO and mixtures thereof.

10. The method according to claim 9, wherein the second dielectric capping layer is an Al-based dielectric.

11. The method according to claim 10, wherein the second dielectric capping layer is selected from the group of AlO, AN and mixtures thereof.

12. The method according to claim 10, wherein the metal gate layer is made of a material having a p-type work function.

13. The method according to claim 12, wherein the metal layer comprises $Ta_xC_yN_zO_w$, with x,y,z,w real numbers and $0<x,y,z,w<1$.

14. The method according to claim 1, wherein the host dielectric is selected from the group of $SiO_2$, SiON, $HfO_2$, $ZrO_2$ and mixtures thereof.

15. The method according to claim 1, wherein the forming of the dielectric buffer layer comprises nitridation of the first dielectric capping layer.

16. The method according to claim 1, wherein the forming of the dielectric buffer layer comprises depositing about one to ten cycles of ALD, HfO2 or HfSiO.

17. The method according to claim 1, wherein the second effective work function is different from the first work function.

18. A method of manufacturing a dual work function semiconductor device, the method comprising:
   forming a host dielectric on and in contact with a substrate in a first and a second region of the substrate;
   selectively forming a first dielectric capping layer and a dielectric buffer layer on the second region but not on the first region, wherein the first dielectric capping layer is over and in direct contact with the host dielectric, wherein the dielectric buffer layer is over the first dielectric capping layer;
   forming a second dielectric capping layer overlying the host dielectric on the first region and the dielectric buffer layer on the second region; and
   forming a gate electrode comprising a metal layer overlying and in contact with the second dielectric capping layer on the first region and the second region,
   wherein the dielectric buffer layer is selected to prevent intermixing between the first and second dielectric capping layer.

19. The method of claim 18, wherein a first gate stack is formed in the first region, the first gate stack comprising the host dielectric, the second dielectric capping layer, and the gate electrode, and a second gate stack is formed in the second region, the second gate stack comprising the host dielectric, the first dielectric capping layer, the dielectric buffer layer, the second dielectric capping layer, and the gate electrode.

20. The method of claim 19, wherein the first gate stack has a first effective work function and the second gate stack has a second effective work function different from the first effective work function.

* * * * *